(12) United States Patent
Savarbaghi

(10) Patent No.: US 10,878,150 B1
(45) Date of Patent: Dec. 29, 2020

(54) LOOP OPTIMIZATION IN A CIRCUIT DESIGN NETLIST

(71) Applicant: Xilinx, Inc., San Jose, CA (US)

(72) Inventor: Hossein Omidian Savarbaghi, Signal Hill, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 16/573,233

(22) Filed: Sep. 17, 2019

(51) Int. Cl.
G06F 30/00 (2020.01)
G06F 30/327 (2020.01)
G06F 30/392 (2020.01)
G06F 30/394 (2020.01)

(52) U.S. Cl.
CPC .......... *G06F 30/327* (2020.01); *G06F 30/392* (2020.01); *G06F 30/394* (2020.01)

(58) Field of Classification Search
CPC ..... G06F 30/327; G06F 30/394; G06F 30/392
See application file for complete search history.

(56) References Cited

U.S. PATENT DOCUMENTS

| | | | | |
|---|---|---|---|---|
| 5,381,343 A * | 1/1995 | Bamji | ............... | G06F 30/398 716/122 |
| 5,572,710 A * | 11/1996 | Asano | ............... | G06F 30/33 703/15 |
| 5,794,062 A * | 8/1998 | Baxter | ............... | G06F 8/447 712/30 |
| 6,088,821 A * | 7/2000 | Moriguchi | ............... | G06F 30/33 714/724 |
| 7,761,847 B2 * | 7/2010 | Kornerup | ............... | G06F 9/4881 717/104 |
| 7,949,973 B1 * | 5/2011 | Neilson | ............... | G06F 30/34 716/104 |
| 8,141,015 B1 * | 3/2012 | Govig | ............... | G06F 30/3312 716/108 |
| 8,281,297 B2 * | 10/2012 | Dasu | ............... | G06F 8/433 717/161 |
| 8,479,128 B2 * | 7/2013 | De | ............... | G06F 30/33 716/106 |
| 9,251,300 B2 * | 2/2016 | Hutton | ............... | G06F 30/00 |
| 9,305,125 B2 * | 4/2016 | Pandey | ............... | G06F 30/3312 |
| 10,540,467 B1 * | 1/2020 | Deaton | ............... | G06F 30/3323 |
| 2015/0121319 A1 * | 4/2015 | Hutton | ............... | G06F 30/327 716/101 |
| 2016/0224710 A1 * | 8/2016 | Dua | ............... | G06F 30/3323 |

OTHER PUBLICATIONS

Weaver, Post-Placement C-slow Retiming for the XilinxVirtex, FPGA'03, Feb. 2003.

(Continued)

*Primary Examiner* — Naum Levin
(74) *Attorney, Agent, or Firm* — Crawford Maunu PLLC

(57) ABSTRACT

Disclosed approaches for optimizing netlist loops include associating loop optimization methods with loop patterns in a computer memory. A circuit design can be synthesized into a netlist, and netlist loops that conform to the loop patterns can be identified. For each matching netlist loop, a loop optimization method associated with the loop pattern to which the netlist loop conforms can be selected. For each netlist loop, the loop optimization method associated with the loop pattern to which the netlist loop conforms can be performed to modify logic of the netlist loop in the netlist.

20 Claims, 10 Drawing Sheets

(56) References Cited

OTHER PUBLICATIONS

Borch, Loose Loops Sink Chips, Proceedings Eighth International Symposium on High Performance Computer Architecture, Feb. 2002.

Liu, Loop Splitting for Efficient Pipelining in High-level Synthesis, 2016 IEEE 24th Annual International Symposium on Field-Programmable Custom Computing Machines, 2016.

Ganusov, Automated Extra Pipeline Analysis of Applications mapped to Xilinx UltraScale+ FPGAs, 2016 26th International Conference on Field Programmable Logic and Applications (FPL), Aug. 2016.

Dai, Enabling Adaptive Loop Pipelining in High-level Synthesis, 2017 51st Asilomar Conference on Signals, Systems, and Computers, Oct. 2017.

ODmidian, Janus: A Compilation System for Balancing Parallelism and Performance in OpenVX, J. Phys: Cont Ser. 1004 012011, Apr. 2018.

* cited by examiner

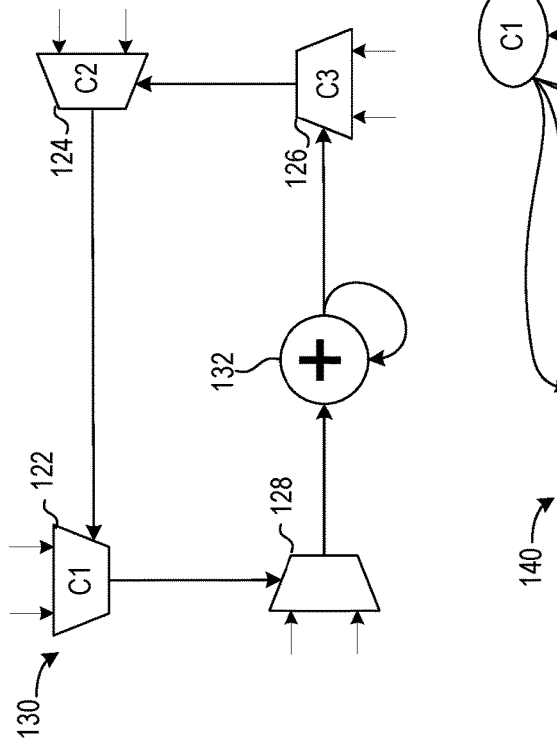
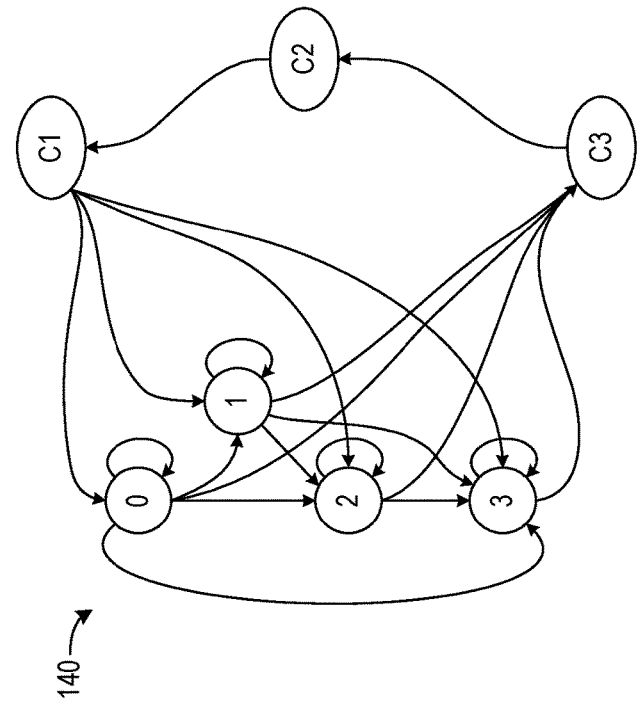
FIG. 2
FIG. 3
FIG. 1

US 10,878,150 B1

LOOP OPTIMIZATION IN A CIRCUIT DESIGN NETLIST

TECHNICAL FIELD

The disclosure generally relates to optimizing looped logic structures in a circuit design netlist.

BACKGROUND

Logic synthesis can produce netlist-level structures that limit the maximum clock frequency at which a circuit can operate without violating timing constraints. In some instances, the slow structures can be modified to improve the maximum clock frequency. A slow structure present in feed-forward logic can be pipelined with the introduction of registers on the most critical paths, which can reduce the number of gates and wire distance that a signal has to traverse in one cycle.

In contrast to feed-forward paths, slow structures in synthesized logic and appearing inside a sequential loop cannot be easily pipelined. Inserting a register in a loop path can break the sequence and functionality of the loop. Improving the performance of sequential loops can require a more complex transformation than simply inserting flip-flops to pipeline the loop.

Many designs have been observed to run below device capability because of slow loops. Loop splitting and similar transformations have been proposed for optimizing loop structures in order to achieve the greatest feasible clock frequency and throughput. However, proposed approaches require a designer to spend considerable time analyzing the design and manually parallelizing and pipelining it as much as possible. Prior approaches require a degree of expertise to implement optimal loop code in the high-level source code or at the register transfer language (RTL) level. Even after employing prior approaches, a netlist produced from synthesis can still contain numerous timing-critical sequential loops.

SUMMARY

A disclosed method includes associating in a computer memory, a plurality of loop optimization methods with a plurality of loop patterns, respectively. The method synthesizes a circuit design into a netlist by a computer processor. The computer processor identifies in the netlist, netlist loops that conform to the loop patterns. The computer processor selects for each netlist loop, a loop optimization method associated with the loop pattern to which the netlist loop conforms. The computer processor performs for each netlist loop, the loop optimization method associated with the loop pattern to which the netlist loop conforms. The performing the loop optimization method includes modifying logic of the netlist loop in the netlist.

A disclosed system includes a computer processor and a computer memory coupled to the computer processor. The computer memory is configured with instructions that when executed cause the computer processor to associate in a computer memory, a plurality of loop optimization methods with a plurality of loop patterns, respectively. In executing the instructions, the computer processor synthesizes a circuit design into a netlist and identifies in the netlist, netlist loops that conform to the loop patterns. Execution of the instructions additionally causes the computer processor to select for each netlist loop, a loop optimization method associated with the loop pattern to which the netlist loop conforms. The computer processor performs for each netlist loop, the loop optimization method associated with the loop pattern to which the netlist loop conforms. The performing the loop optimization method includes modifying logic of the netlist loop in the netlist.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which:

FIG. 1 shows a portion of hardware description language (HDL) source code specifying an independent loop;

FIG. 2 shows an approximate logic netlist schematic of the source code of FIG. 1;

FIG. 3 shows a graphical representation of the logic netlist of FIG. 2 in the form of a dependency graph;

DETAILED DESCRIPTION

Figure 5:
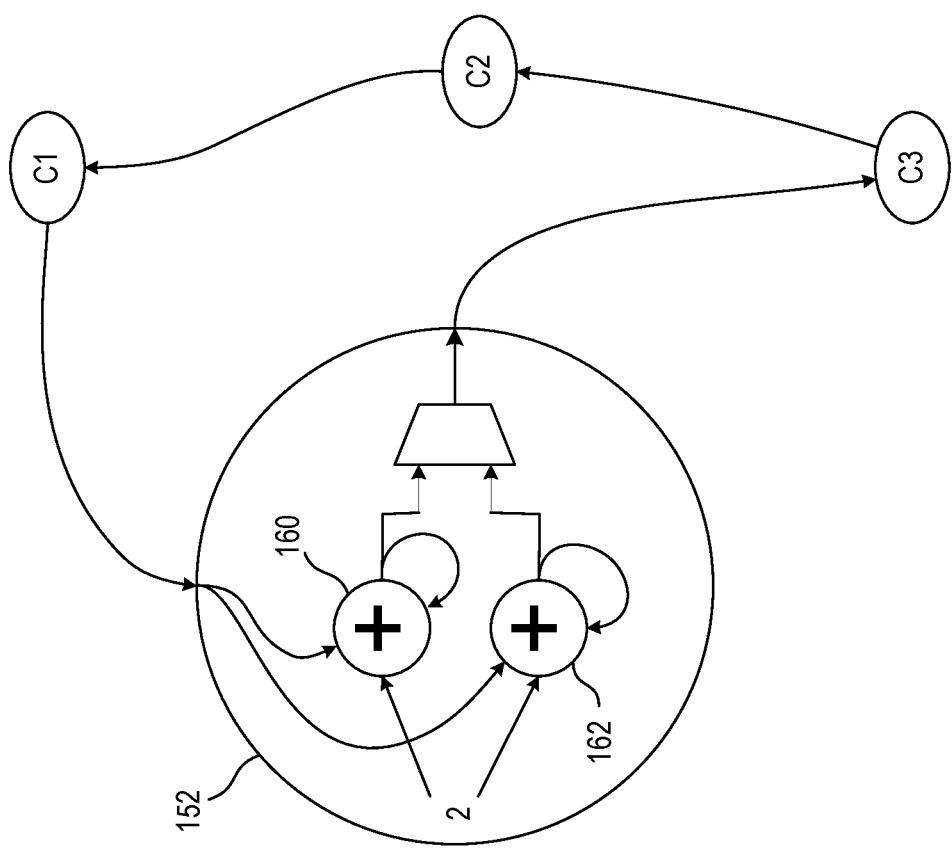
FIG. 5 illustrates transformation of the netlist loop represented by the counter of FIG. 2.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

According to the disclosed approaches, a circuit design flow is improved with the addition of loop analysis in the physical optimization stage after synthesis, and with optimization of loop structures found in the netlist. In one aspect, large independent loops in the netlist are identified, and then primitive loops within the independent loops are identified. An "independent loop" is a netlist loop that is not contained in another loop. A "primitive loop" is a netlist loop that is recognizable as having an optimization strategy, such as replacement with an alternative netlist structure or suggested compiler directives. A graphical representation of the netlist can be simplified by replacing multiple vertices and edges of primitive loops with a single vertex, which makes loop structures easier to comprehend. Simplified loops can be viewed by designers (RTL designers and high-level synthesis (HLS) designers) to observe the resulting low-level implementations, and inform design practices for avoiding complex loop patterns.

Well understood and recognized independent loop structures, such as counters, can be tagged in the circuit design netlist. The tagging can be effected using compiler information from the high-level code. After synthesizing the high-level circuit design, logic optimization can be performed to achieve the greatest feasible clock frequency. The optimized netlist can be placed-and-routed in order to accurately analyze timing and determine critical paths. Feed-forward logic and sequential loop logic in the placed-and-routed are identified. For feedforward logic, automated pipeline analysis can be performed to achieve the desired clock frequency for feed-forward logic. If sequential loop logic is on a critical path(s), loop analysis can be performed to resolve the timing violation.

In performing loop analysis, a library of loop patterns is used to identify primitive loop patterns within independent loops. Each loop pattern in the library can have an associated optimization method, which can automatically modify the netlist or provide suggestions to the designer for manually modifying the netlist or inserting compiler directives. The loop analysis identifies in each independent loop, each netlist loop that conforms to a primitive loop pattern in the loop library.

A graphical representation of an independent loop having one or more netlist loops that conform to one or more primitive loop patterns in the library can be simplified by replacing the vertices and edges of the matching netlist loops with a single vertex. The simplified graphical representation of the independent loop can then be added to the loop library for subsequent matching with other independent loops.

For each netlist loop in the independent loop, the optimization method associated with the matching loop pattern can be selected and performed. The loop optimization method can include modifying logic of the netlist loop in the netlist and/or suggesting complier directives to the designer.

FIGS. 1-14 provide non-limiting examples to illustrate application of the disclosed loop optimization approaches. The examples illustrate a high-level circuit design specification, a netlist representation, graphical representations of netlists, simplification of an independent loop, different primitive netlist loop patterns, and application of different loop optimization methods.

FIG. 1 shows a portion of hardware description language (HDL) source code specifying an independent loop. Synthesis tools transform a design from source code into a logic circuit represented as a netlist. A netlist specifies connections of different components of a target integrated circuit (IC) device. For example, a netlist can specify connection between different field programmable gate array (FPGA) logic resources, such as look-up tables (LUTs), flip-flops (FFs), block RAMs (BRAMs), and digital signal processors (DSPs).

The code in block 102 specifies a condition for incrementing a counter; the code in block 104 specifies conditions for assigning values to variable C3; the code in block 106 specifies conditions for assigning values to C2; and the code in block 108 specifies conditions for assigning values to C1.

FIG. 2 shows an approximate logic netlist schematic of the source code of FIG. 1. The if-statements in the source code are represented by multiplexers 122, 124, 126, and 128. The incrementing of the counter variable is represented by adder logic 132. The netlist structure 130 can be tagged by the designer or automatically tagged by a compiler for loop analysis. For example, a user can include a compiler directive in the source code specification of blocks 102, 104, 106, and 108 of FIG. 1, and the compiler can carry forward the tag information to the netlist representation 130.

FIG. 3 shows a graphical representation of the logic netlist of FIG. 2 in the form of a dependency graph 140. A loop analysis tool can generate the graph 140 from the netlist 130. Each of the vertices labeled 0, 1, 2, and 3 represents a one bit of a 4-bit variable counter. The if-statements of FIG. 1 and corresponding multiplexers shown in FIG. 2 are represented by vertices labeled C1, C2, and C3. Vertices 0, 1, 2, and 3 correspond to the multiplexer 128 and adder logic 132, which add 0 or 1 to the current value, as controlled by C1.

The example of FIGS. 1, 2, and 3 shows that four different parts (blocks 102, 104, 106, and 108) of the source code can result in a low-level loop. The low-level loop is exemplified by the 0, 1, 2, and 3 vertices. According to the disclosed approaches, the netlist 130 (FIG. 2) can be tagged as an independent loop, and the graphical representation 140 can be analyzed to identify the low-level loop, simplify the graph, and optimize the low-level loop.

The primitive loop patterns in the loop library can be compared to sub-graphs of the graph 140 in order to identify any netlist loops (sub-graphs) in the graph 140 that conform to loop patterns in the loop library. Determining matching/conforming sub-graphs can be accomplished through sub-graph isomorphism.

Figure 4:
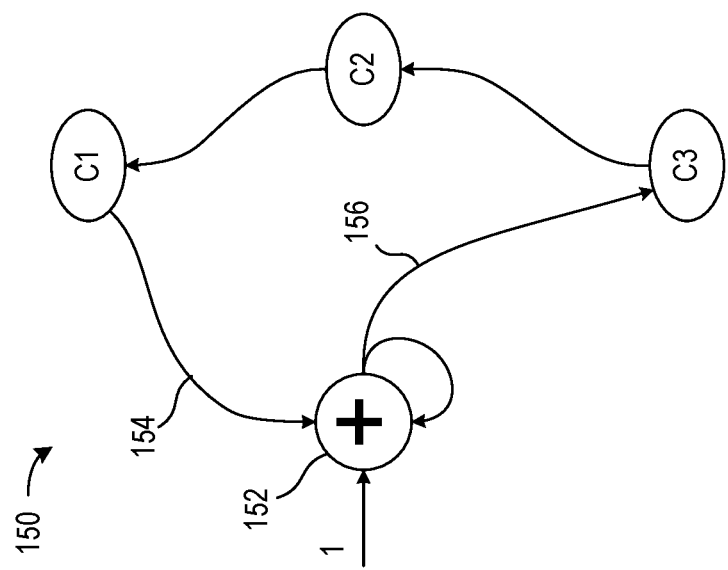
FIG. 4 illustrates a simplified graph generated from the graph of FIG. 3.

FIG. 4 illustrates simplified graph 150 generated from the graph 140 of FIG. 3. The 0, 1, 2, and 3 vertices of graph 140 are replaced by and represented by the single vertex 152. The multiple edges directed to the 0, 1, 2, and 3 vertices of graph 140 in FIG. 3 are replaced by the single edge 154, and the multiple edges directed to the C3 vertex are replaced by the single edge 156. The graph 150 can be added to the library of loop patterns.

If the netlist loop represented by vertex 152 is on a critical path, the loop can be optimized by performing the optimization method associated with the pattern. In the example, a loop splitting method can be associated with the primitive loop pattern, and the loop splitting method can be selected and performed to improve the clock frequency.

FIG. 5 illustrates transformation of the netlist loop represented by the counter 132 of FIG. 2 by performing a loop splitting method. The counter is split into two separate and parallel logic loops. One loop, which is shown as vertex 160, outputs odd values, and the other loop, which is shown as vertex 162, outputs even values. Each loop increments by 2. The clock frequency of each counter can remain the same as the original netlist 130 (FIG. 2). The output of the two counters can be sampled at twice the original clock speed, however, because two values are generated per clock cycle. The optimization may eliminate the loop as a critical path and potentially allow the clock frequency to be increased by factor of two.

The automated identification and transformation of loop structures can be beneficial over manual approaches. Designers may be unaware of how some loops are generated, because a single loop can result from different portions of an RTL specification and a designer may not recognize that the different portions would result in a netlist loop. In addition, logic optimization techniques can further obscure the original source logic that led to a netlist loop. Manually splitting a counter prior to synthesis can involve adding another clock to the design, which results in additional constraints for synthesis, placement and routing processes. The disclosed automated approach, however, is aware of the clocks available in the design and where the netlist loop is planned to be placed, which reduces complications of splitting the counter.

Figure 6:
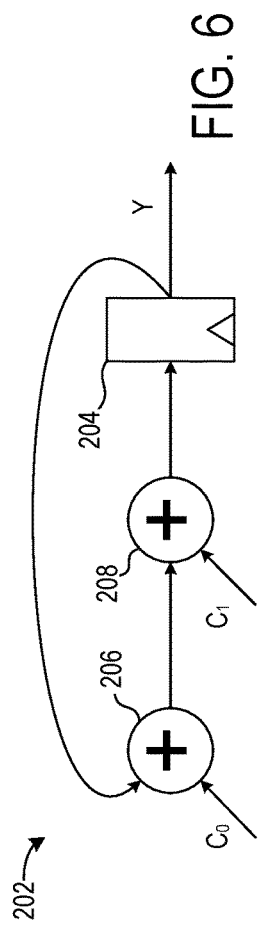
FIG. 6 shows the netlist of another loop pattern that s recognizable and can be suitable for loop optimization.

FIG. 6 shows the netlist 202 of another loop pattern that is recognizable and can be suitable for loop optimization. The netlist 202 implements the function:

$$Y(t)=C_1+(C_0+Y(t-1))$$

where "t" denotes a clock cycle. While not shown, it will be appreciated that loop analysis would include generation of a graphical representation of the netlist 202 and matching the resulting graph to a primitive loop pattern in the loop library.

The example of FIG. 6 shows a netlist loop having functions that are associative and is thereby suitable for associative refactoring. The pattern is an adder chain having adders 206 and 208 with a feedback loop, which can be referred to as a "loose loop" as the output from flip-flop/register 204 is fed-back as input to adder 206, The order of addition operations can be changed, and the loose loop can be transformed to a tight loop, because the add operation has associative property.

Figure 7:
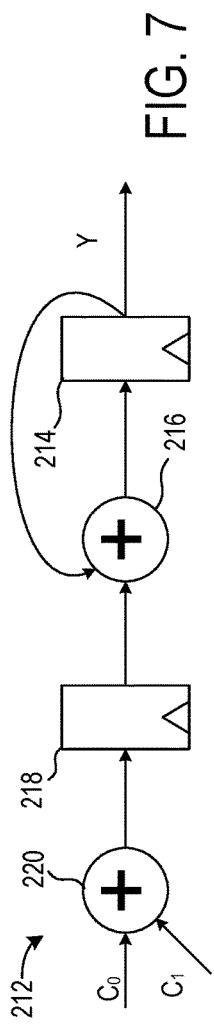
FIG. 7 shows a resulting transformation of the adder chain of FIG. 6.

FIG. 7 shows a resulting transformation of the adder chain of FIG. 6. The netlist 212 implements the function:

$$Y(t)=Y(t-1)+(C_1+C_0)$$

The loose loop of FIG. 6 is transformed into a tight loop in netlist 212. The tight loop implements an accumulator with register 214 and adder 216. In addition, a pipeline register 218 is inserted between adders 220 and 216. The exemplary transformation can improve the maximum clock frequency by a factor of two.

Figure 8:
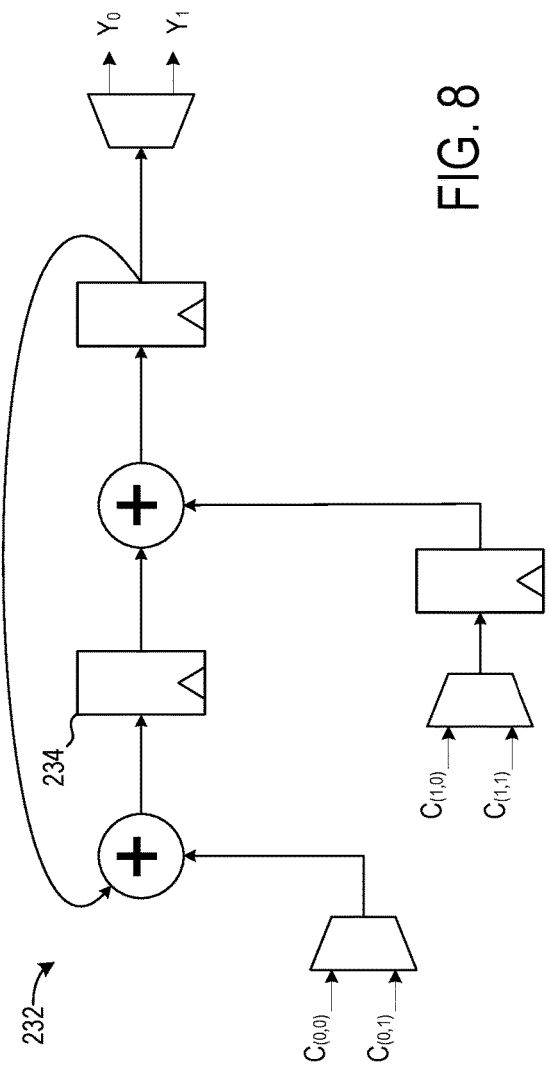
FIG. 8 illustrates an alternative transformation of the associative function of the netlist of FIG. 6.

FIG. 8 illustrates an alternative transformation of the associative function of the netlist 202 of FIG. 6. The alternative transformation can involve adding pipeline stages inside the loop to increase the frequency. However, simply adding pipeline stages inside the loop can change the sequence of the loop. For example, if a register is added between the adders 206 and 208 (FIG. 6), the clock frequency can be increased by a factor of two, but the new circuit only generates one valid output every two clock cycles, and the throughput is not improved.

The additional register 234 presents an opportunity to combine two isomorphic loop patterns and generate a valid output from each of the loops on alternate clock cycles. The netlist 232 implements the function:

$$Y_i(t)=C_{(1,i)}+(C_{(0,i)})+Y_i(t-1))$$

The $C_{(x,y)}$ notation references the $C_x$ input variable in the $y^{th}$ loop pattern. For example, $C_{(1,1)}$ refers to the input variable $C_1$ in loop pattern 1.

Netlist 232 shows a combined-pipelined loop. With each clock cycle, one output is generated for each loop in an alternating manner. The transformation shown by FIG. 8 can save circuit area by implementing one pipelined loop N times faster instead of N slower, separate loops.

Figure 10:
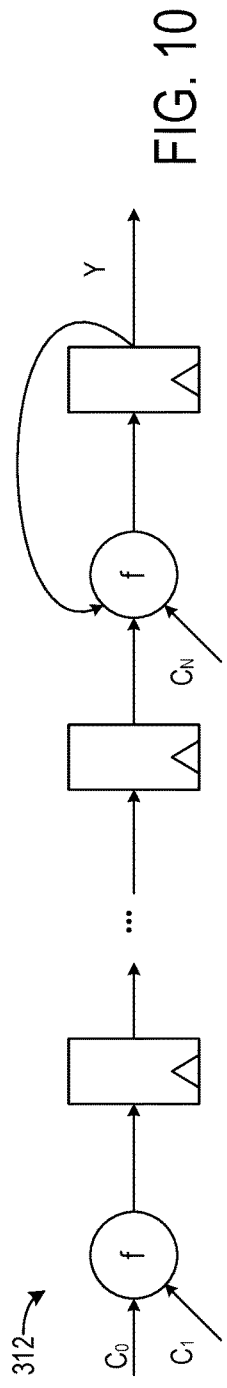
FIG. 10 shows netlist resulting from associative refactoring of the associative function of FIG. 9.
Figure 11:
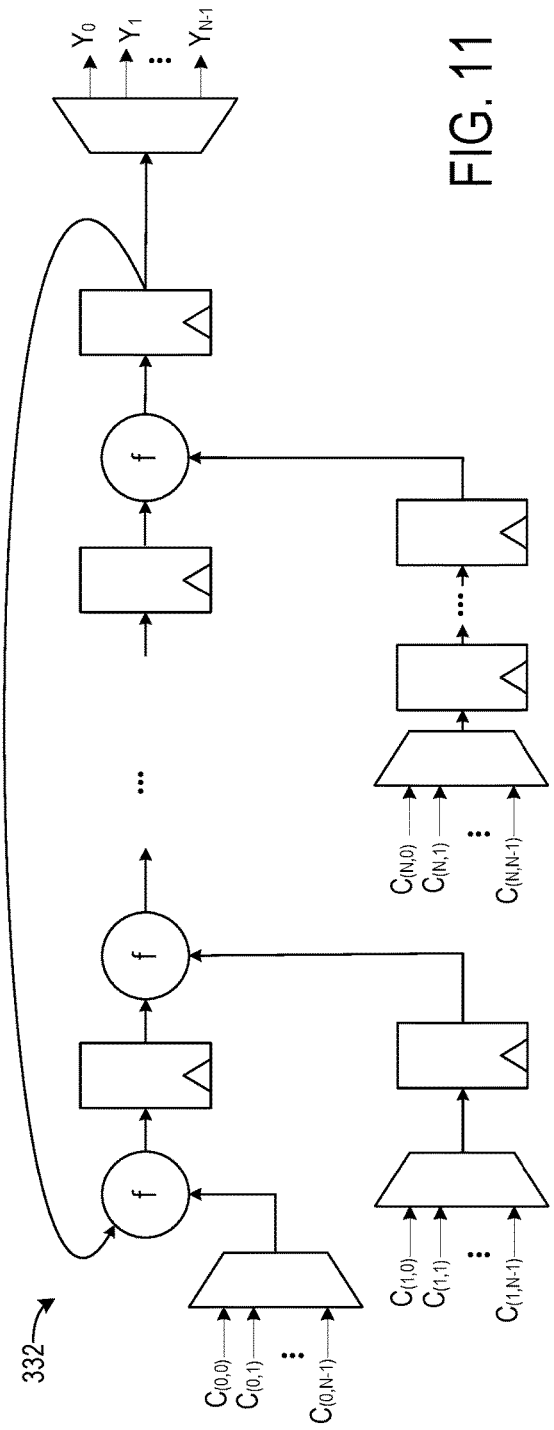
FIG. 11 shows a netlist resulting from combining N isomorphic loop patterns.

The exemplary transformations of FIGS. 7 and 8 can be generalized to any function that is associative. FIGS. 7 and 8 show transformations of an associative function involving adders. FIGS. 10 and 11 show transformations of an associative function involving operations denoted, "f," in FIG. 9.

Figure 9:
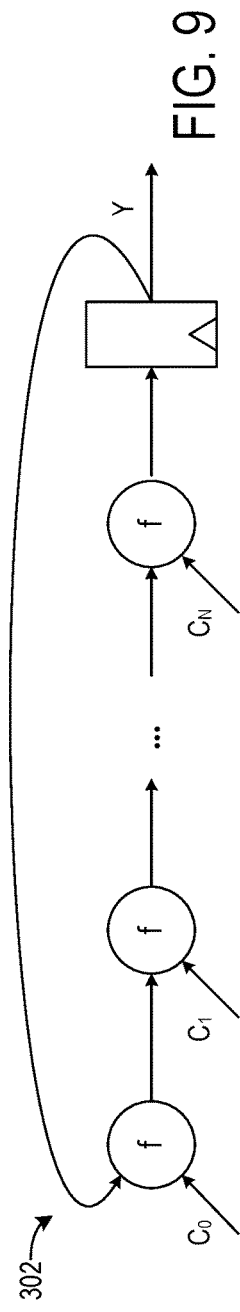
FIG. 9 shows a netlist of the associative function involving operations labeled f.

FIG. 9 shows the netlist 302 of the associative function involving operations, f. The netlist 302 implements the function:

$$Y(t)=f(C_N,f(\ldots f(C_1,f(C_0,Y(t-1)))\ldots))$$

The function of FIG. 9 can be transformed into a function chain with a tight loop feedback at the end as shown in FIG. 10, which is similar to the transformation shown in FIG. 7.

FIG. 10 shows netlist 312 resulting from associative refactoring of the associative function involving operations, f. The netlist 312 implements the function:

$$Y(t)=f(Y(t-1),f(C_N,f(C_1,C_0)\ldots))$$

The netlist 312 is structured similar to the netlist 212 of FIG. 7.

FIG. 11. shows a netlist 332 resulting from combining N isomorphic loop patterns. The netlist 332 implements the function:

$$Y_i(t)=f(Y_1(t-1),f(C_{(N,i)},\ldots f(C_{(1,i)},C_{(0,i)}\ldots))$$

Figure 12:
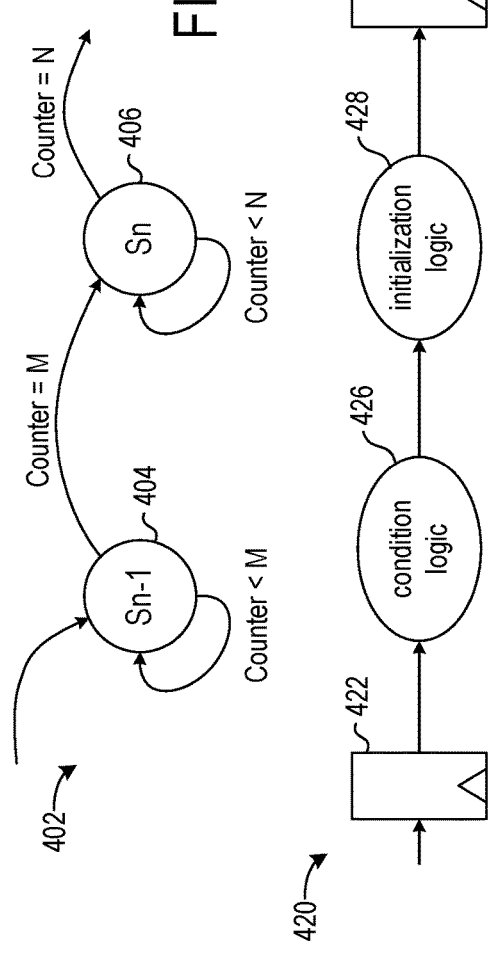
FIG. 12 shows an exemplary finite state machine (FSM)
Figure 13:
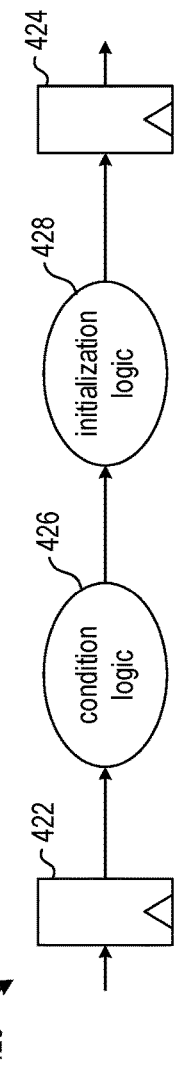
FIG. 13 shows the netlist generated from the FSM of FIG. 12.
Figure 14:
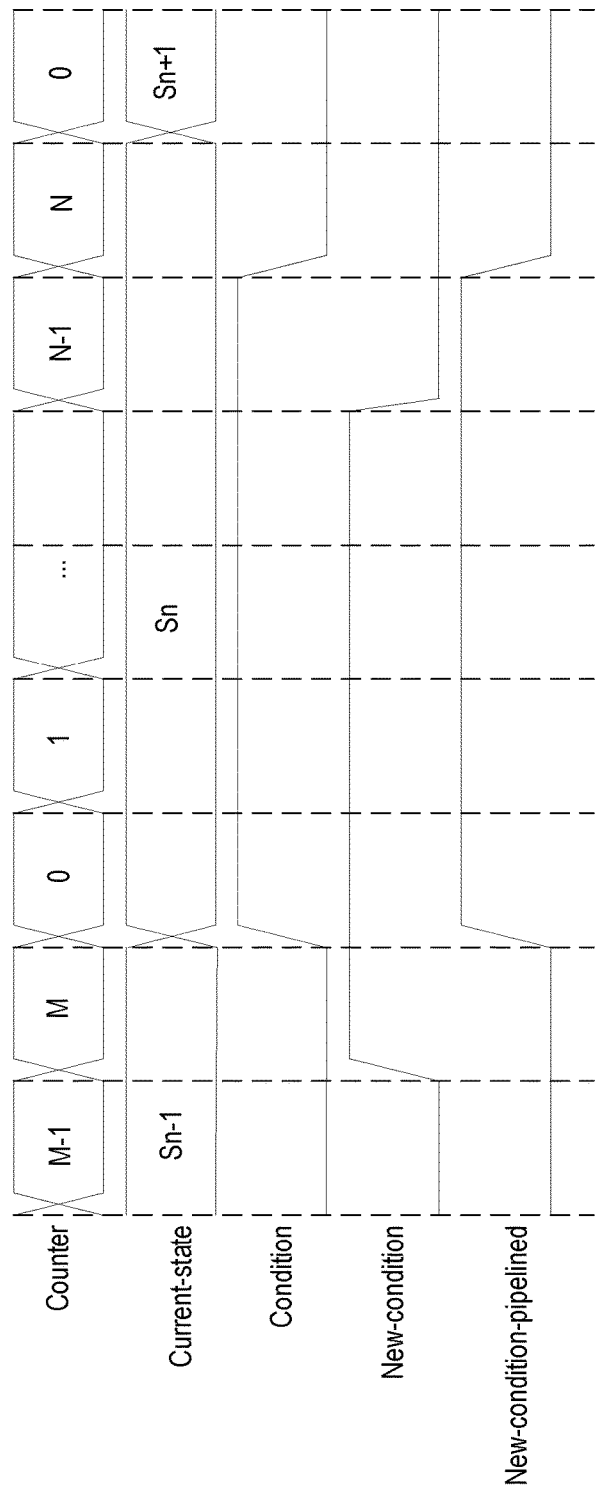
FIG. 14 shows waveforms of the counter signal, current-state signal, original condition signal, new-condition signal; and new-condition-pipelined signal.

FIGS. 12, 13, and 14 show an example involving another exemplary transformation of a sequential netlist loop. The transformation is referred to as an "early condition" transformation.

FIG. 12 shows an exemplary finite state machine (FSM) 402. Each state 404 and 406 waits for fixed amount of time using a counter. For example, state 404, which is labeled "Sn," initializes its counter to zero and waits in the same state while counter is less than N. With counters that count to values represented by a large number of bits (e.g., 16 bits), conditions such as "counter <N" followed by initialization of the current state and next state, often result in several levels of logic. The multiple levels of logic can slow down the circuit.

FIG. 13 shows the netlist 420 generated from the FSM 402 of FIG. 12. The netlist includes registers 422 and 424 at ends of the netlist, and there are two sections of logic between the registers. Logic 426 represents condition logic (counter <N), and logic 428 represents initialization logic of the FSM.

The clock frequency associated with the FSM can be increased by adding a pipeline stage between condition logic 426 and initialization logic 428. However, the additional register would generate the final condition one clock cycle late. Instead, the condition can be generated one cycle early.

FIG. 14 shows waveforms of the counter signal, current-state signal, original condition signal, new-condition signal, and new-condition-pipelined signal. To correct the circuit, we add a new condition, computed one cycle early. After a pipeline delay, this can be combined with the initialization logic. The logic equation that defines the new-condition signal is:

(Current-state=$S_{n-1}$ AND Counter>$M-1$) OR (Current-state=$S_n$ AND Counter<$N-1$)

The new-condition signal can be delayed by one cycle pipeline delay to make the new-conditioned-pipelined signal equivalent to the original condition signal.

Figure 15:
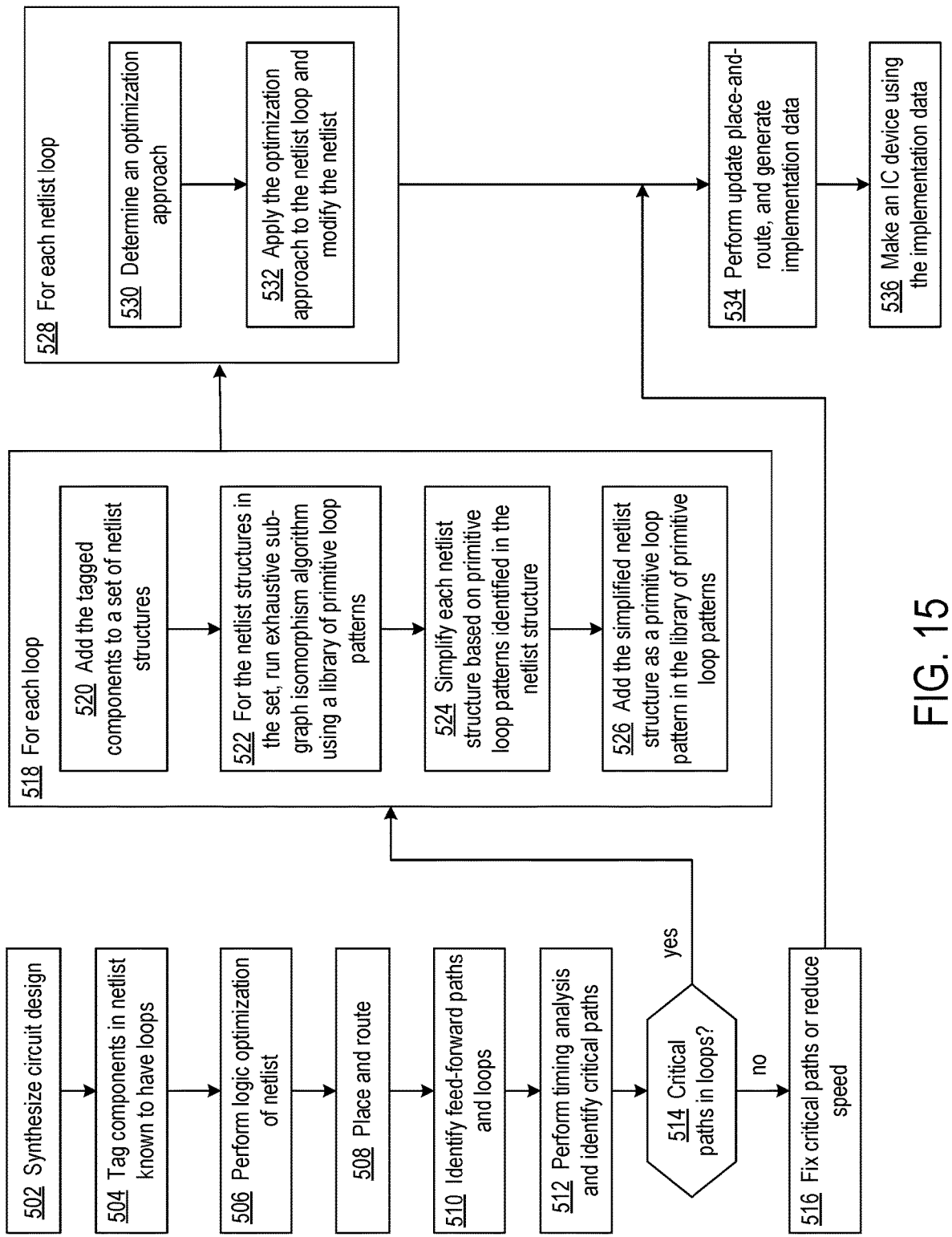
FIG. 15 shows a flowchart of an exemplary process of analyzing a circuit design netlist for sequential loops and modifying the netlist logic to support an increased clock speed.

FIG. 15 shows a flowchart of an exemplary process of analyzing a circuit design netlist for sequential loops and modifying the netlist logic to support an increased clock speed. At block 502, a circuit design tool synthesizes a circuit design using recognized processes in conjunction with tagging components in the netlist at block 504 to indicate loop structures to be analyzed and considered for optimization. The synthesizer can tag components in the netlist in response to directives or specifically formatted comments in the source code, for example. Alternatively, the synthesis tool can tag well-recognized structures such as counters.

At block 506, a circuit design tool performs customary logic optimization of the netlist to obtain a maximum feasible clock frequency. After logic optimization, the netlist is placed-and-routed at block 508 by the design tool. Once placed-and-routed, at block 510 the circuit design tool identifies feed-forward paths and sequential loops in the netlist.

The design tool performs timing analysis on the placed-and-routed circuit design at block 512 and identifies critical paths in the circuit design. At decision block 514, the design tool determines if there are any sequential loops in critical paths. Critical paths having sequential loops can be determined based on the tagging of components at block 504. If there are no sequential loops in the critical paths, the design tool proceeds to block 516 to fix the feed-forward critical paths, if possible, allow the designer to modify the circuit design, or reduce the clock speed.

If a critical path has one or more sequential loops, the design tool proceeds to block 518, where loop analysis is performed on each sequential loop that is on a critical path. The processing of block 518 includes operations of blocks 520, 522, 524, and 526.

At block 520, the design tool adds the tagged components (from block 504), which indicate a sequential loop, to a set of netlist structures. At block 522, the design tool executes an exhaustive sub-graph isomorphism process using a library of primitive loop patterns and the set of netlist structures. That is, the design tool determines any sub-graphs of the set of netlist structures that conform to any of the primitive loop patterns in the library.

For matching netlist structures, at block 524 the design tool simplifies the representative graph of the netlist. The netlist structure can be represented as a graph of vertices and edges. The graph can be simplified by generating a modified graph of a structure in response to a subset of the vertices and edges that represent the structure matching a loop pattern of the plurality of loop patterns. The simplification can include representing the subset of the vertices and edges by a single vertex in the modified graph. At block 526, the modified graph can be added to the library of loop patterns.

The design tool performs the processing of block 528, which includes blocks 530 and 532, for each netlist loop found in the netlist structures from block 518. At block 530, the design tool determines an optimization method for the netlist loop. The optimization method can be selected based on the method being associated with the primitive loop pattern from the loop library that matched the netlist loop. At block 532, the design tool applies the optimization method to the netlist loop and modifies the netlist. The optimization methods can include loop splitting, associative refactoring, loop combining, and early condition generation as described above. The optimization methods can further include loop cutting.

After modifying the circuit design netlist, at block 534 the design tool performs incremental place-and-route and generates circuit implementation data. For example bitstream generation tools may be executed to generate configuration data for an FPGA. Other tools can generate configuration data from which an application-specific (ASIC) can be fabricated. At block 536, a circuit can be implemented by way of configuring a programmable IC with the configuration data or fabricating, making, or producing an ASIC from the configuration data, thereby creating a circuit that operates according to the resulting circuit design.

FIGS. 16-20 illustrate examples involving simplification of complex loops.

Figure 16:
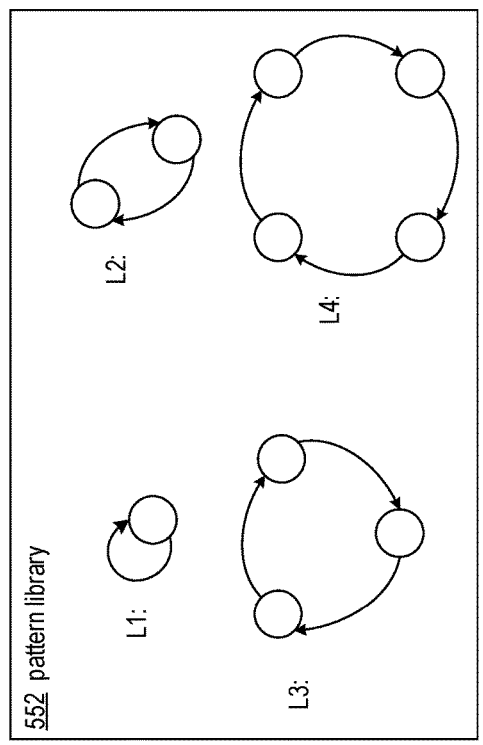
FIG. 16 shows an exemplary loop library having loop patterns L1, L2, L3, and L4.

FIG. 16 shows an exemplary loop library 552 having loop patterns L1, L2, L3, and L4. Each loop pattern can have an associated optimization method that can be selected to perform on a matching netlist loop.

Figure 17:
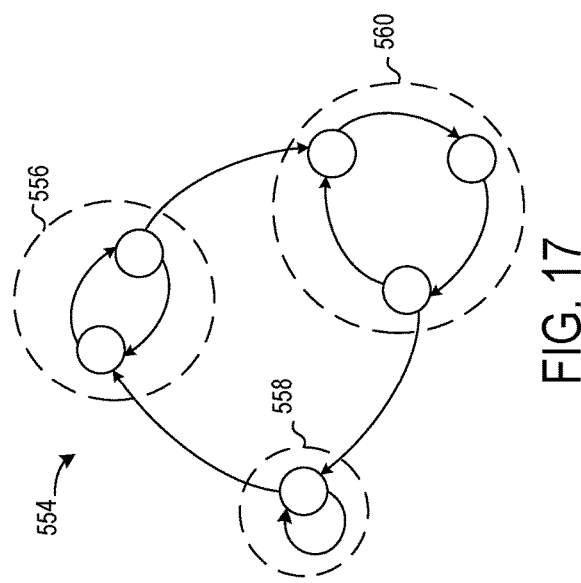
FIG. 17 shows a dependency graph that represents a complex netlist loop.

FIG. 17 shows a dependency graph 554 that represents a complex netlist loop. The design tool can match sub-graphs 556, 558, and 560 of the graph 554 to loop patterns L2, L1, and L3 of the library 552, respectively.

Figure 18:
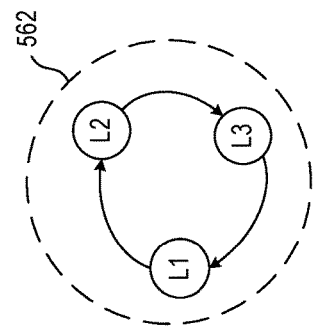
FIG. 18 shows a simplification of the dependency graph of FIG. 17.

FIG. 18 shows a simplification of the dependency graph 554 of FIG. 17. Sub-graphs 556, 558, and 560 are replaced by vertices corresponding to L2, L1, and L3, respectively. As the simplified graph 562 matches loop pattern L3 in the library 552, the simplified graph does not need to be added to the library.

Figure 19:
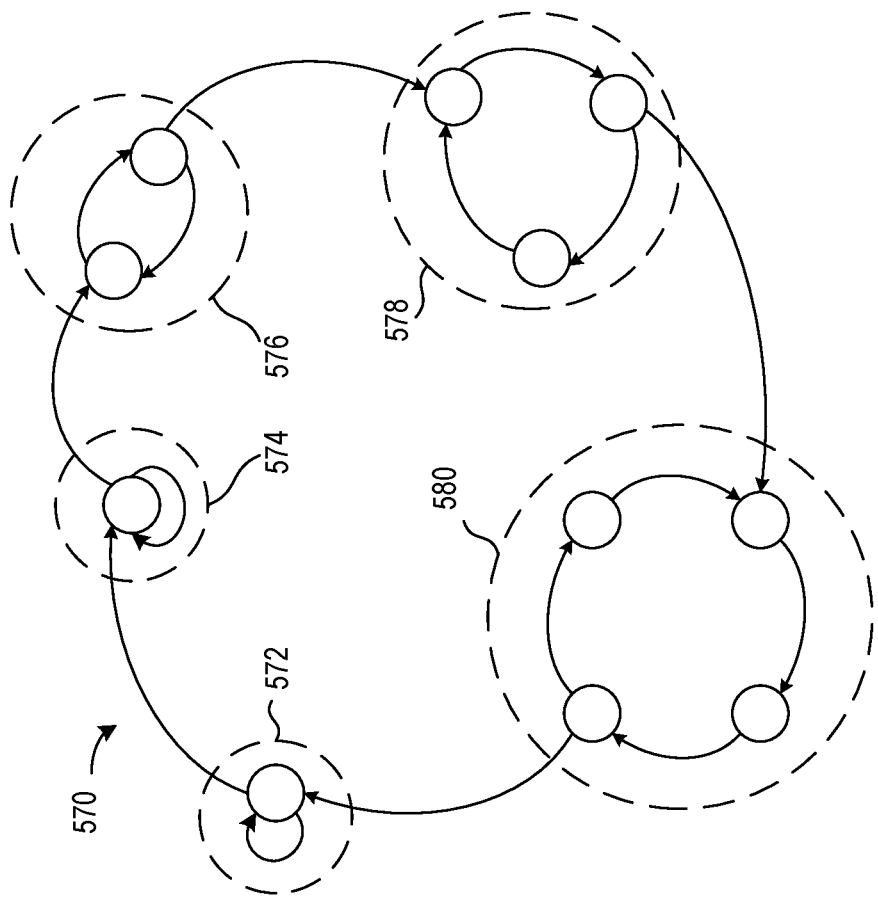
FIG. 19 shows a dependency graph that represents another complex netlist loop.

FIG. 19 shows a dependency graph 570 that represents another complex netlist loop. The design tool can match sub-graphs 572, 574, 576, 578, and 580 of the graph 570 to loop patterns L1, L1, L2, L3, and L4 of the library 552, respectively.

Figure 20:
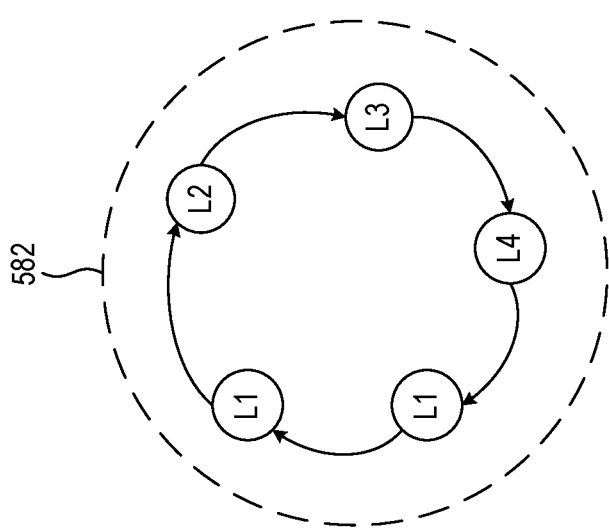
FIG. 20 shows a simplification of the dependency graph of FIG. 19.

FIG. 20 shows a simplification of the dependency graph 570 of FIG. 19. Sub-graphs 572, 574, 576, 578, and 580 are replaced by vertices corresponding to L1, L1, L2, L3, and L4 of the library 552, respectively. As the simplified graph 582 does not match a loop pattern in the library 552, the simplified graph is added to the library. The simplification of graphs can extend to multiple levels of hierarchy. For example, loop pattern 582 can be a sub-graph of another loop pattern subsequently added to the library.

Figure 21:
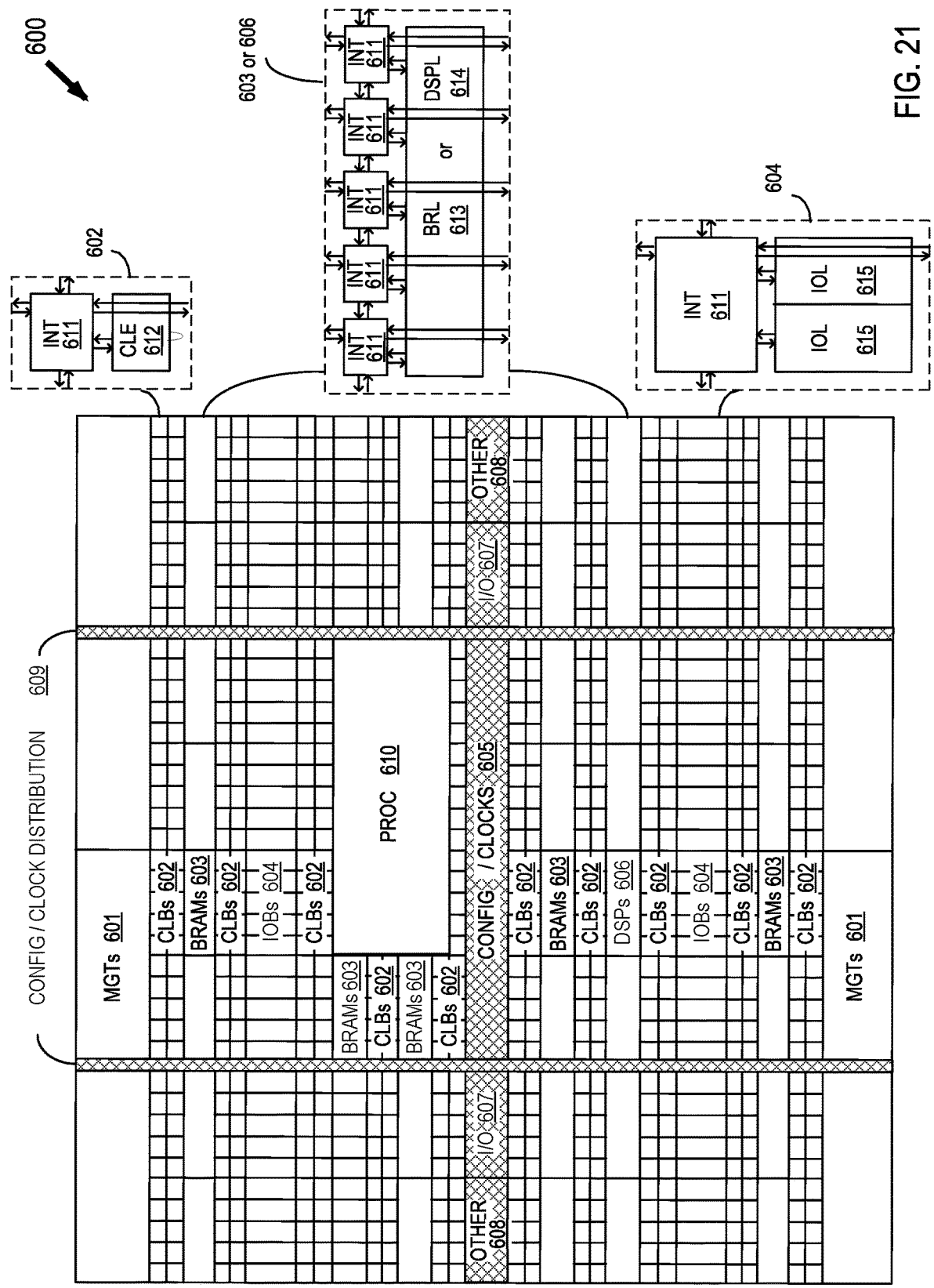
FIG. 21 shows a programmable integrated circuit (IC) on which the circuits generated by the disclosed processes can be implemented.

FIG. 21 shows a programmable integrated circuit (IC) 600 on which the circuits generated by the disclosed processes can be implemented. The programmable IC may also be referred to as a System On Chip (SOC) that includes field programmable gate array logic (FPGA) along with other programmable resources. FPGA logic may include several different types of programmable logic blocks in the array. For example, FIG. 21 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 21.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

A columnar area near the center of the die (shown shaded in FIG. 21) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 21 include additional logic blocks that disrupt the regular columnar structure making up a large part of the programmable IC, The additional logic blocks can be programmable blocks and/or dedicated logic. For example, the processor block PROC 610 shown in FIG. 21 spans several columns of CLBs and BRAMs.

Note that FIG. 21 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 21 are purely exemplary. For example, in an actual programmable IC, more than one adjacent column of CLBs is typically included wherever the CLBs appear, to facilitate the efficient implementation of user logic.

Figure 22:
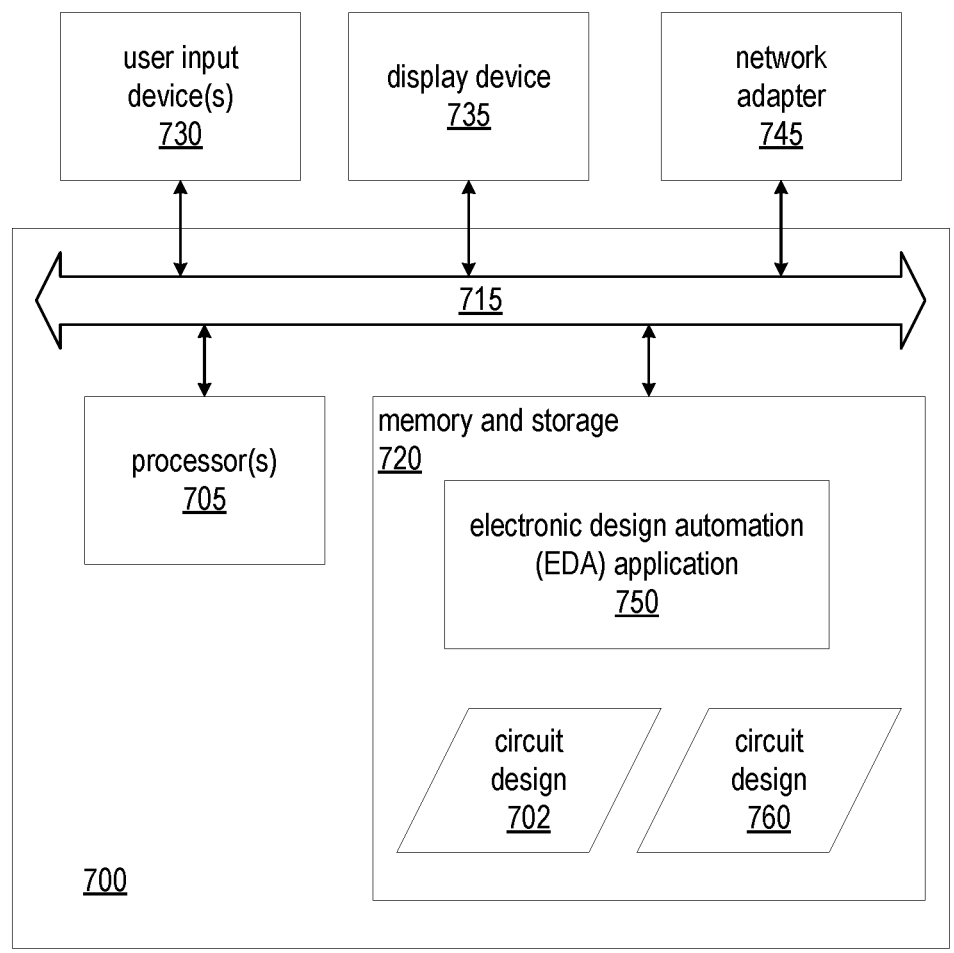
FIG. 22 is a block diagram illustrating an exemplary data processing system.

FIG. 22 is a block diagram illustrating an exemplary data processing system (system) 700. System 700 is an example of an EDA system. As pictured, system 700 includes at least one processor circuit (or "processor"), e.g., a central processing unit (CPU) 705 coupled to memory and storage arrangement 720 through a system bus 715 or other suitable circuitry. System 700 stores program code and circuit design 702 within memory and storage arrangement 720. Processor 705 executes the program code accessed from the memory and storage arrangement 720 via system bus 715. In one aspect, system 700 is implemented as a computer or other data processing system that is suitable for storing and/or executing program code. It should be appreciated, however, that system 700 can be implemented in the form of any system including a processor and memory that is capable of performing the functions described within this disclosure.

Memory and storage arrangement 720 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 700 may also include one or more cache memories (not shown) that provide temporary storage of at least some program code and data in order to reduce the number of times program code and data must be retrieved from local memory and persistent storage during execution.

Input/output (I/O) devices such as user input device(s) 730 and a display device 735 may be optionally coupled to system 700. The I/O devices may be coupled to system 700 either directly or through intervening I/O controllers. A network adapter 745 also can be coupled to system 700 in order to couple system 700 to other systems, computer systems, remote printers, and/or remote storage devices through intervening private or public networks. Modems, cable modems, Ethernet cards, and wireless transceivers are examples of different types of network adapter 745 that can be used with system 700.

Memory and storage arrangement 720 may store an EDA application 750. EDA application 750, being implemented in the form of executable program code, is executed by processor(s) 705. As such, EDA application 750 is considered part of system 700. System 700, while executing EDA application 750, receives and operates on circuit design 100. In one aspect, system 700 performs a design flow on circuit design 702, and the design flow may include synthesis, mapping, placement, routing, and the application of loop analysis and optimization techniques as described herein. System 700 generates an optimized, or modified, version of circuit design 702 as circuit design 760.

EDA application 750, circuit design 702, circuit design 760, and any data items used, generated, and/or operated upon by EDA application 750 are functional data structures that impart functionality when employed as part of system 700 or when such elements, including derivations and/or modifications thereof, are loaded into an IC such as a programmable IC causing implementation and/or configuration of a circuit design within the programmable IC.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for optimizing sequential loops in circuit design netlists. Other aspects and features will be apparent to those skilled in the art from consideration of the specification. It is intended that the specification and drawings be considered as examples only, with a true scope of the invention being indicated by the following claims.

What is claimed is:

1. A method comprising:
associating in a computer memory, a plurality of loop optimization methods with a plurality of loop patterns, respectively;
synthesizing a circuit design into a netlist by a computer processor;
identifying in the netlist by the computer processor, netlist loops that conform to the loop patterns;
selecting for each netlist loop, a loop optimization method associated with the loop pattern to which the netlist loop conforms; and
performing for each netlist loop, the loop optimization method associated with the loop pattern to which the netlist loop conforms, wherein the performing the loop optimization method includes modifying logic of the netlist loop in the netlist.

2. The method of claim 1, wherein the identifying includes comparing one or more structures in the netlist to the plurality of loop patterns.

3. The method of claim 2, wherein the comparing includes determining whether each structure of the one or more structures contains a subgraph that is isomorphic to a loop pattern of the plurality of loop patterns.

4. The method of claim 2, wherein the identifying includes selecting the one or more structures for comparison in response each structure of the one or more structures being tagged for loop analysis.

5. The method of claim 4, wherein each structure of the one or more structures is represented as a graph having vertices and edges in the computer memory, and the method further comprising:
generating a modified graph of a structure of the one or more structures in response to a subset of the vertices and edges that represent the structure matching a loop pattern of the plurality of loop patterns, wherein the generating the modified graph includes representing the subset of the vertices and edges by a single vertex in the modified graph; and
adding the modified graph to the plurality of loop patterns.

6. The method of claim 1, wherein:
the selecting includes selecting a loop splitting method; and
the modifying includes splitting a function of the netlist loop into parallel logic.

7. The method of claim 1, wherein:
the selecting includes selecting an associative refactoring method; and
the modifying includes reordering and pipelining functions of the netlist loop.

8. The method of claim 1, wherein:
the selecting includes selecting a combining method; and
the modifying includes combining two or more isomorphic loops of the netlist loop into pipeline logic that generates respective valid outputs during respective clock cycles.

9. The method of claim 1, wherein:
the selecting includes selecting an early-condition method; and
the modifying includes modifying timing of condition logic in the netlist loop to generate a condition signal at least one cycle earlier than in the netlist loop prior to modification, and including at least one pipeline register to capture and delay the condition signal.

10. The method of claim 1, further comprising:
determining one or more critical paths in the netlist;
wherein the identifying includes:
selecting one or more structures from the netlist in response to the one or more structures being on the one or more critical paths; and
comparing the one or more structures to the plurality of loop patterns.

11. The method of claim 10, further comprising placing and routing the netlist prior to the determining the critical path.

12. The method of claim 1, further comprising:
placing and routing the netlist prior to the identifying the netlist loops;
performing after the modifying the logic, an incremental place-and-route that generates an updated placed-and-routed netlist;
generating implementation data from the updated placed-and-routed netlist; and
making an integrated circuit from the implementation data.

13. A system comprising:
a computer processor;
a computer memory coupled to the computer processor and configured with instructions that when executed cause the computer processor to perform operations including:
associating in a computer memory, a plurality of loop optimization methods with a plurality of loop patterns, respectively;
synthesizing a circuit design into a netlist by a computer processor;
identifying in the netlist by the computer processor, netlist loops that conform to the loop patterns;
selecting for each netlist loop, a loop optimization method associated with the loop pattern to which the netlist loop conforms; and
performing for each netlist loop, the loop optimization method associated with the loop pattern to which the netlist loop conforms, wherein the performing the loop optimization method includes modifying logic of the netlist loop in the netlist.

14. The system of claim 13, wherein the instructions for identifying include instructions that when executed by the computer processor cause the computer processor to compare one or more structures in the netlist to the plurality of loop patterns.

15. The system of claim 14, wherein the instructions for comparing include instructions that when executed by the computer processor cause the computer processor to determine whether each structure of the one or more structures contains a subgraph that is isomorphic to a loop pattern of the plurality of loop patterns.

16. The system of claim 14, wherein the instructions for identifying include instructions that when executed by the computer processor cause the computer processor to select the one or more structures for comparison in response each structure of the one or more structures being tagged for loop analysis.

17. The system of claim 16, wherein each structure of the one or more structures is represented as a graph having vertices and edges in the computer memory, and the computer memory is configured with instructions that when executed by the computer processor cause the computer processor to:
generate a modified graph of a structure of the one or more structures in response to a subset of the vertices and edges that represent the structure matching a loop pattern of the plurality of loop patterns, wherein the generating the modified graph includes representing the subset of the vertices and edges by a single vertex in the modified graph; and add the modified graph to the plurality of loop patterns.

18. The system of claim 13, wherein:

the instructions for selecting include instructions that when executed by the computer processor cause the computer processor to select a loop splitting method; and the instructions for modifying include instructions that when executed by the computer processor cause the computer processor to split a function of the netlist loop into parallel logic.

19. The system of claim 13, wherein:

the instructions for selecting include instructions that when executed by the computer processor cause the computer processor to select an associative refactoring method; and the instructions for modifying include instructions that when executed by the computer processor cause the computer processor to reorder and pipeline functions of the netlist loop.

20. The system of claim 13, wherein:

the instructions for selecting include instructions that when executed by the computer processor cause the computer processor to select an early-condition method; and the instructions for modifying include instructions that when executed by the computer processor cause the computer processor to modify timing of condition logic in the netlist loop to generate a condition signal at least one cycle earlier than in the netlist loop prior to modification, and include at least one pipeline register to capture and delay the condition signal.

* * * * *